United States Patent
Umezaki et al.

(10) Patent No.: US 12,325,934 B2
(45) Date of Patent: *Jun. 10, 2025

(54) SINGLE-CRYSTAL SILICON CARBIDE WAFER, AND SINGLE-CRYSTAL SILICON CARBIDE INGOT

(71) Applicant: CENTRAL GLASS COMPANY, LIMITED, Ube (JP)

(72) Inventors: Tomonori Umezaki, Tokyo (JP); Kazuto Kumagai, Tokyo (JP)

(73) Assignee: CENTRAL GLASS COMPANY, LIMITED, Ube (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/682,999

(22) PCT Filed: Sep. 26, 2022

(86) PCT No.: PCT/JP2022/035724
§ 371 (c)(1),
(2) Date: Feb. 12, 2024

(87) PCT Pub. No.: WO2023/054264
PCT Pub. Date: Apr. 6, 2023

(65) Prior Publication Data
US 2024/0344237 A1    Oct. 17, 2024

(30) Foreign Application Priority Data
Sep. 30, 2021 (JP) .................. 2021-160608

(51) Int. Cl.
B32B 3/02       (2006.01)
C30B 29/36    (2006.01)
C30B 29/64    (2006.01)

(52) U.S. Cl.
CPC .............. *C30B 29/36* (2013.01); *C30B 29/64* (2013.01)

(58) Field of Classification Search
CPC ............................... C30B 29/36; C30B 29/64
See application file for complete search history.

(56) References Cited

U.S. PATENT DOCUMENTS

| 7,972,704 B2 | 7/2011 | Ohtani et al. |
| 8,765,091 B2 | 7/2014 | Loboda et al. |
| 9,777,399 B2 | 10/2017 | Danno |

(Continued)

FOREIGN PATENT DOCUMENTS

| JP | H10007488 A | 1/1998 |
| JP | 2009091222 A | 4/2009 |

(Continued)

OTHER PUBLICATIONS

International Search Report issued on Oct. 25, 2022, in corresponding International Application No. PCT/JP2022/035724; 5 pages.

*Primary Examiner* — Elizabeth E Mulvaney
(74) *Attorney, Agent, or Firm* — Maier & Maier, PLLC

(57) ABSTRACT

A single-crystal silicon carbide wafer of the present invention includes boron at a concentration of $1.0 \times 10^{16}$ atoms/$cm^3$ or less, and a region where a misorientation in a crystal plane of the single-crystal silicon carbide wafer (31) is 50 arcsec or less is present on the surface. An area of the region is one fourth or more of an area of the surface of the single-crystal silicon carbide wafer.

20 Claims, 7 Drawing Sheets

(56) References Cited

U.S. PATENT DOCUMENTS

| | | | |
|---|---|---|---|
| 2006/0137600 A1* | 6/2006 | Ellison | C30B 25/00 |
| | | | 257/E29.198 |
| 2010/0289033 A1 | 11/2010 | Ohtani et al. | |
| 2012/0114545 A1 | 5/2012 | Loboda et al. | |
| 2016/0122901 A1 | 5/2016 | Danno | |
| 2018/0315842 A1* | 11/2018 | Tawara | H01L 29/1095 |
| 2023/0279580 A1* | 9/2023 | Horiai | C30B 25/14 |
| | | | 428/698 |
| 2024/0186380 A1* | 6/2024 | Urata | H01L 21/2015 |
| 2024/0191392 A1* | 6/2024 | Horiai | C30B 29/36 |
| 2024/0368806 A1* | 11/2024 | Umezaki | C30B 29/36 |

FOREIGN PATENT DOCUMENTS

| | | |
|---|---|---|
| JP | 2009167047 A | 7/2009 |
| JP | 2011506253 A | 3/2011 |
| JP | 2013075771 A | 4/2013 |
| JP | 2015030640 A | 2/2015 |
| JP | 2016088794 A | 5/2016 |
| JP | 2016164120 A | 9/2016 |
| JP | 2018111639 A | 7/2018 |
| WO | 2014189008 A1 | 11/2014 |
| WO | 2017047536 A1 | 3/2017 |

* cited by examiner

SINGLE-CRYSTAL SILICON CARBIDE WAFER, AND SINGLE-CRYSTAL SILICON CARBIDE INGOT

FIELD

The present invention relates to a single-crystal silicon carbide wafer, and a single-crystal silicon carbide ingot.

BACKGROUND

Related arts are disclosed in Patent Documents 1 to 7.

Patent Document 1 discloses a single-crystal silicon carbide obtained by a solution growth method. Furthermore, Patent Document 1 discloses a basal plane dislocation density and the like of the single-crystal silicon carbide.

Patent Document 2 discloses a single-crystal silicon carbide obtained by a sublimation recrystallization method. Furthermore, Patent Document 2 discloses a basal plane dislocation density, a carrier concentration, and the like of the single-crystal silicon carbide.

Patent Document 3 discloses a single-crystal silicon carbide obtained by a solution growth method. Furthermore, Patent Document 3 discloses a boron concentration, a nitrogen concentration, and the like of the single-crystal silicon carbide.

Patent Document 4 discloses a single-crystal silicon carbide obtained by a sublimation recrystallization method. Furthermore, Patent Document 4 discloses a boron concentration, a nitrogen concentration, an aluminum concentration, a resistivity, and the like of the single-crystal silicon carbide.

Patent Document 5 discloses a single-crystal silicon carbide obtained by a sublimation recrystallization method. Furthermore, Patent Document 5 discloses a boron concentration, a nitrogen concentration, an aluminum concentration, a resistivity, and the like of the single-crystal silicon carbide.

Patent Document 6 discloses a single-crystal silicon carbide obtained by a sublimation recrystallization method. Furthermore, Patent Document 6 discloses a nitrogen concentration, an aluminum concentration, a specific resistance, a lamination defect density, and the like of the single-crystal silicon carbide.

Patent Document 7 discloses a single-crystal silicon carbide obtained by a solution growth method.

PATENT DOCUMENT

[Patent Document 1] International Publication No. 2017/047536
[Patent Document 2] Japanese Unexamined Patent Publication No. 2016-164120
[Patent Document 3] Japanese Unexamined Patent Publication No. 2016-88794
[Patent Document 4] PCT Japanese Translation Patent Publication No. 2011-506253
[Patent Document 5] Japanese Unexamined Patent Publication No. 2009-167047
[Patent Document 6] Japanese Unexamined Patent Publication No. 2015-30640
[Patent Document 7] Japanese Unexamined Patent Publication No. 2018-111639

SUMMARY

An object of the present invention is to realize a high-quality single-crystal silicon carbide that is not disclosed in Patent Documents 1 to 7.

According to the present invention, there is provided:
a single-crystal silicon carbide wafer,
in which boron is included at a concentration of $1.0 \times 10^{16}$ atoms/cm$^3$ or less in the single-crystal silicon carbide wafer,
a region where a misorientation in a crystal plane of the single-crystal silicon carbide wafer is 50 arcsec or less is present on a surface of the single-crystal silicon carbide wafer,
the region includes a center of the surface, and
an area of the region is one fourth or more of an area of the surface.

Furthermore, according to the present invention, there is provided:
a single-crystal silicon carbide ingot having a substantially circular columnar shape or a substantially polygonal columnar shape,
in which boron is included at a concentration of $1.0 \times 10^{16}$ atoms/cm$^3$ or less in a wafer cut perpendicular to a crystal growth direction,
a region where a misorientation in a crystal plane of the single-crystal silicon carbide wafer is 50 arcsec or less is present on a surface of the wafer,
the region includes a center of the surface, and
an area of the region is one fourth or more of an area of the surface.

According to the present invention, a new high-quality single-crystal silicon carbide is realized.

DETAILED DESCRIPTION

Figure 1:
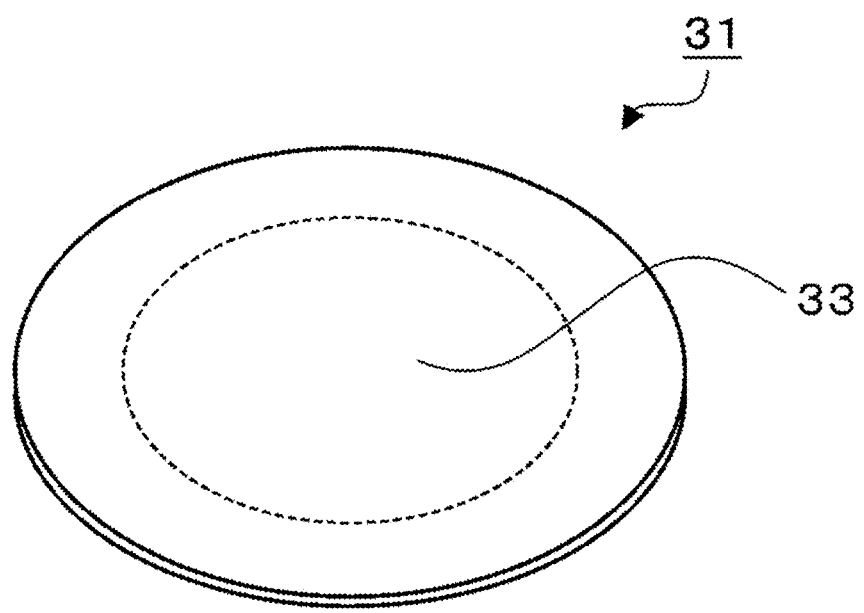
FIG. 1 is a view of a single-crystal silicon carbide wafer 31 according to the present embodiment.

Hereinafter, embodiments of the present invention will be described with reference to the drawings. In all drawings, the same components are designated by the same reference numerals, and description thereof will not be repeated.

In addition, in the present specification, "to" indicates that the upper limit value and lower limit value are included, unless otherwise expressly stated.

Moreover, in the present specification, "-1" in the notations of a (000-1) surface and the like is noted as "-1" instead of originally attaching a horizontal line over the number. 4H—SiC or 6H—SiC represents a silicon carbide crystal having a crystal polymorph of 4H or 6H. H represents a hexagonal crystal, and the number represents the number of regular tetrahedron structural layers included in one period in a stacking direction.

<Single-Crystal Silicon Carbide Wafer>

Next, the single-crystal silicon carbide wafer of the present embodiment will be described. FIG. 1 shows an example of the single-crystal silicon carbide wafer 31 of the present embodiment. The single-crystal silicon carbide wafer 31 having a circular surface shape is shown in the figure. Furthermore, the single-crystal silicon carbide wafer 31 having a polygonal shape (hexagonal shape or the like) instead of the circular shape may be used. It is preferable that the single-crystal silicon carbide wafer 31 has a diameter of 100 mm or more and a thickness of 50 μm or more and 500 μm or less.

The single-crystal silicon carbide wafer 31 is preferably cut from an ingot so that the surface is +5 degrees or less from the (0001) surface of 4H—SiC or 6H—SiC, and the surface of the single-crystal silicon carbide wafer 31 may have an off angle that is inclined by 0.5 degrees or more and 5 degrees or less from the (0001) surface of the single-crystal silicon carbide. Incidentally, the single-crystal silicon carbide wafer 31 may have a flat portion called an orientation flat or a groove called a notch.

The single-crystal silicon carbide wafer 31 has the following features 1 and 2. In addition, the single-crystal silicon carbide wafer 31 preferably has the following features 3 and 4.

(Feature 1) The single-crystal silicon carbide wafer 31 includes boron at a concentration of $1.0 \times 10^{16}$ atoms/cm$^3$ or less. Boron is included as an unavoidable impurity.

Feature 1 is that the concentration of boron, which is an unavoidable impurity, is sufficiently reduced to $1.0 \times 10^{16}$ atoms/cm$^3$ or less. In addition, Feature 1 is also that the concentration range of boron which is an unavoidable impurity (the range of the concentration that can be mixed in the single-crystal silicon carbide wafer 31) is sufficiently narrowed down to more than 0 and $1.0 \times 10^{16}$ atoms/cm$^3$ or less. The range may be preferably more than 0 and $1.0 \times 10^{15}$ atoms/cm$^3$ or less.

As the concentration of boron, which is an unavoidable impurity to be unintentionally added, increases, there is a possibility that the characteristics (for example, crystallinity and electrical characteristics) of the single-crystal silicon carbide wafer 31 deviate significantly from intended values. In addition, in a case where an unavoidable impurity is mixed, it may be necessary to design various characteristics of products in consideration of the mixing. Furthermore, in a case where the concentration of the impurity cannot be predicted or in a case the possible concentration range is wide where even though the prediction is possible, it becomes difficult to design products. The single-crystal silicon carbide wafer 31 with Feature 1 has a narrow concentration range of boron, which is an unavoidable impurity to be unintentionally added, of $1.0 \times 10^{16}$ atoms/cm$^3$ or less. Therefore, it becomes relatively easy to design products in consideration of the concentration of boron.

Moreover, from the viewpoint that, in a case where the boron concentrations at a plurality of points in a plane are measured, the boron concentrations at all measurement points are $1.0 \times 10^{16}$ atoms/cm$^3$ or less, and an in-plane variation in the boron concentrations is small, it is considered that in-plane uniformity of the crystallinity or the electrical characteristics of the obtained single-crystal silicon carbide wafer 31 is good.

The concentration of boron is a value measured at one point at the center of the single-crystal silicon carbide wafer 31 by secondary ion mass spectrometry (SIMS). As the boron concentration in the present embodiment, a value measured in a dynamic SIMS mode using a secondary ion mass spectrometer (IMS 6f, CAMECA) was used.

Moreover, the variation in the boron concentration was evaluated based on the measurement results at one point at the center (hereinafter referred to as a "central point") of the single-crystal silicon carbide wafer 31 and four points in the periphery 50 mm apart from the center (hereinafter referred to as "peripheral points"). The boron concentrations at these five points were measured by the same method as the measurement method for the one point at the center. Furthermore, in the present specification, in four pairs of the central point and each of the four peripheral points, an evaluation value is calculated by an expression of "(Boron concentration at peripheral point-Boron concentration at central point)/Boron concentration at central point", and in a case where an average value of the evaluation values of the four pairs is −0.3 or more and 3.0 or less, and more preferably in a case where all of the evaluation values of the four pairs are −0.3 or more and 3.0 or less, the variation was defined to be small.

(Feature 2) A region where a misorientation in a crystal plane of the single-crystal silicon carbide wafer 31 is 50 arcsec or less is present on a surface of the single-crystal silicon carbide wafer 31. Hereinafter, the region is referred to as a "central region 33". As shown in FIG. 1, the central region 33 includes the center of the surface of the single-crystal silicon carbide wafer 31 and is an undivided region. It is preferable that the center of the central region 33 and the center of the surface of the single-crystal silicon carbide wafer 31 overlap, and it is more preferable that the shape of the central region 33 and the shape of the surface of the single-crystal silicon carbide wafer 31 are the same as or similar to each other. Furthermore, the area of the central region 33 is one fourth or more of the area of the surface of the single-crystal silicon carbide wafer 31. In addition, the central region 33 may be preferably one third or more of the surface area.

Feature 2 is that a central region 33 having a misorientation in a crystal plane sufficiently reduced to be as less as 50 arcsec or less is provided, and the central region 33 is as wide as one fourth or more of the surface area and includes the center of the surface. The central region 33 has excellent crystallinity by suppressing a strain in the crystal. The crystallinity is preferably 40 arcsec or less.

The misorientation is an average value of the measurement results of the misorientation using an X-ray diffraction method at each of a total of five points of one point at the center of the single-crystal silicon carbide wafer 31 and four points in the outer peripheral part of the wafer (0 degrees, 90 degrees, 180 degrees, and 270 degrees, each of which is a point 80% of the wafer radius apart from the center). In the present embodiment, the measurement was performed using an X-ray diffractometer (SmartLab manufactured by Rigaku Corporation).

(Feature 3) The electrical resistivity of the single-crystal silicon carbide wafer 31 is 60 mΩcm or less. Feature 3 is that the electrical resistivity is 60 mΩcm or less and the conductivity is excellent. The electrical resistivity is preferably 50 mΩcm or less, and more preferably 30 mΩcm or less.

The electrical resistivity is an average value of the measurement results at each of a total of five points of one point at the center of the single-crystal silicon carbide wafer 31 and four points in the outer peripheral part of the wafer (0 degrees, 90 degrees, 180 degrees, and 270 degrees, each of which is a point 80% of the wafer radius apart from the center). The measurement method is a non-contact measurement by an eddy current method. In the present embodiment, the measurement was performed using EC-80P from Napson Corporation.

(Feature 4) A basal plane dislocation density of the region (central region 33) is 100 counts/cm$^2$ or less. Feature 4 is that the basal plane dislocation density is sufficiently reduced to as less as 100 counts/cm$^2$ or less and the crystallinity is improved. The basal plane dislocation density may be preferably 80 counts/cm$^2$ or less, and more preferably 50 counts/cm$^2$ or less.

The basal plane dislocation in the present specification refers to a dislocation that can be observed by an etch pit method using KOH, and a value measured by the etch pit method using KOH is used as the basal plane dislocation density. Specifically, the single-crystal silicon carbide wafer 31 CMP-polished on an Si surface side was immersed, for 30 minutes in an air atmosphere, in a KOH melt which had been heated to 520° C. After being taken out, the single-crystal silicon carbide wafer 31 was washed with ultrapure water and used for measurement.

The single-crystal silicon carbide wafer 31 with Features 1 and 2 is a wafer having a low concentration of boron which is an unavoidable impurity, a narrow concentration range thereof, and excellent crystallinity due to a reduction in in-plane misorientation. In addition, as shown in the following Comparative Examples, it was found that in a case where the boron concentration is more than $1.0\times10^{16}$ atoms/cm$^3$, the misorientation in the crystal plane tends to increase as the boron concentration increases. Although detailed mechanism thereof is not clear, it is conjectured that by setting the boron concentration to $1.0\times10^{16}$ atoms/cm$^3$ or less, the misorientation in the crystal plane is easily reduced.

Moreover, the single-crystal silicon carbide wafer 31 with Features 3 and/or 4 in addition to Features 1 and 2 is a wafer achieving both of conductivity and crystallinity. The conductivity is caused by a conductive impurity included in the single-crystal silicon carbide wafer 31. Examples of the conductive impurity include a donor-type conductive impurity (hereinafter sometimes referred to as a "donor type") and an acceptor-type conductive impurity (hereinafter sometimes referred to as an "acceptor type"), and the higher a carrier concentration that can be calculated from a difference between the donor type and the acceptor type, the lower the electrical resistivity can be. However, in particular, it is known that as the concentration of the donor-type conductive impurity increases, the crystallinity tends to decrease.

A suitable embodiment of the present invention may be more preferably an n-type single-crystal silicon carbide wafer 31 having a donor-type conductive impurity and an acceptor-type conductive impurity, in which the amount of the donor-type conductive impurity is more than that of the acceptor-type conductive impurity. In the embodiment, the basal plane dislocation can be reduced even in a range where the n-type carrier concentration is in the range of $1\times10^{19}$ atoms/cm$^3$ or more and $10\times10^{19}$ atoms/cm$^3$ or less. In addition, the concentration of the donor-type conductive impurity may be preferably $1\times10^{18}$ atoms/cm$^3$ or more and $1\times10^{21}$ atoms/cm$^3$ or less, and more preferably $5\times10^{18}$ atoms/cm$^3$ or more and $2\times10^{20}$ atoms/cm$^3$ or less.

As the donor-type conductive impurity, for example, nitrogen or phosphorus is well-known, and the donor-type conductive impurity may be more preferably nitrogen. In addition, as the acceptor-type conductive impurity, an element belonging to Group 13 of the periodic table is well known, and the present invention has found that since the suitable characteristics as described above can be obtained by reducing the boron concentration, an element belonging to Group 13 of the periodic table excluding boron is preferable as the acceptor-type conductive impurity of the embodiment. The acceptor-type conductive impurity may be more preferably aluminum, gallium, or indium. Furthermore, the concentration of the conductive impurities can be measured by the same method as that for the boron concentration.

<Single-Crystal Silicon Carbide Ingot>

Next, the single-crystal silicon carbide ingot of the present embodiment will be described. The single-crystal silicon carbide ingot of the present embodiment may have a substantially circular columnar shape or a substantially polygonal columnar shape. In addition, the two flat surfaces may be the upper surface and the lower surface, and surfaces in contact with the upper surface and the lower surface may be the side surfaces. The upper surface and the lower surface are surfaces parallel to an A-A' sectional view or a D-D' sectional view, which will be described later.

Figure 2A:
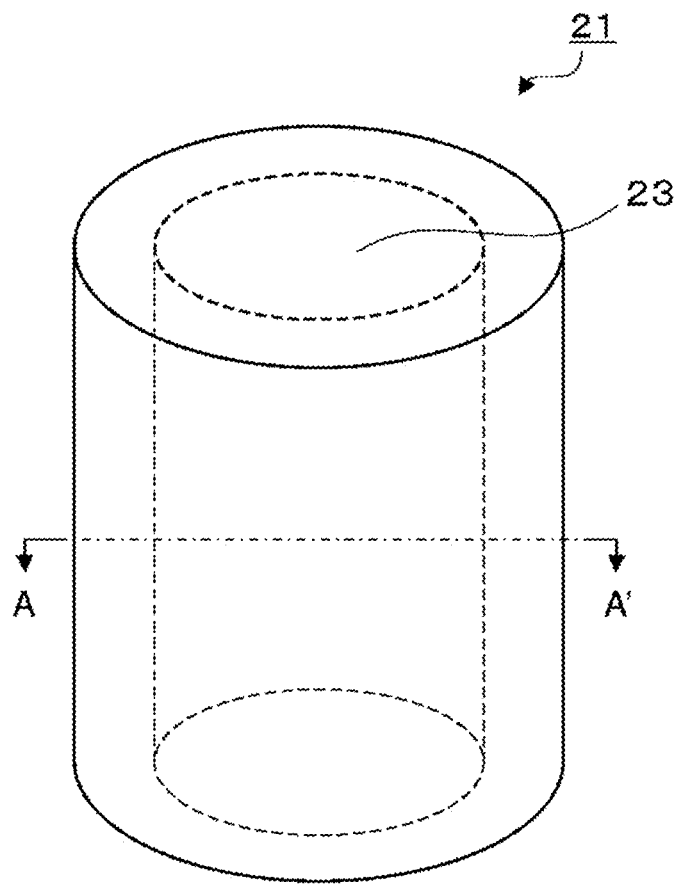
FIG. 2A is a view of a single-crystal silicon carbide ingot 21 according to the present embodiment.
Figure 2B:
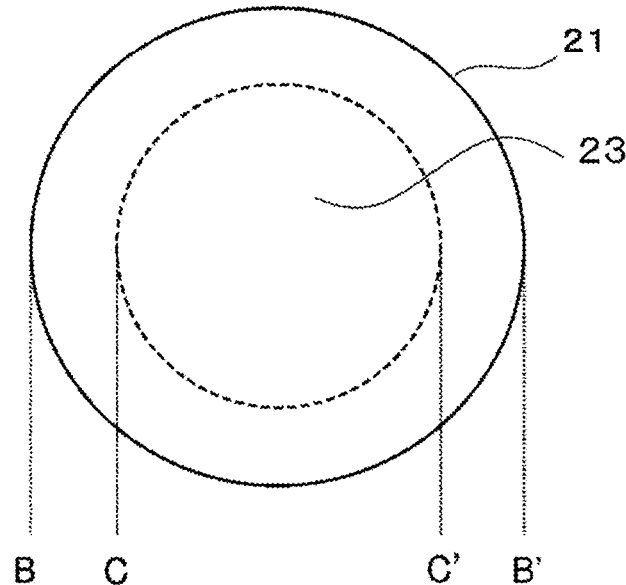
FIG. 2B is an A-A' sectional view.
Figure 3A:
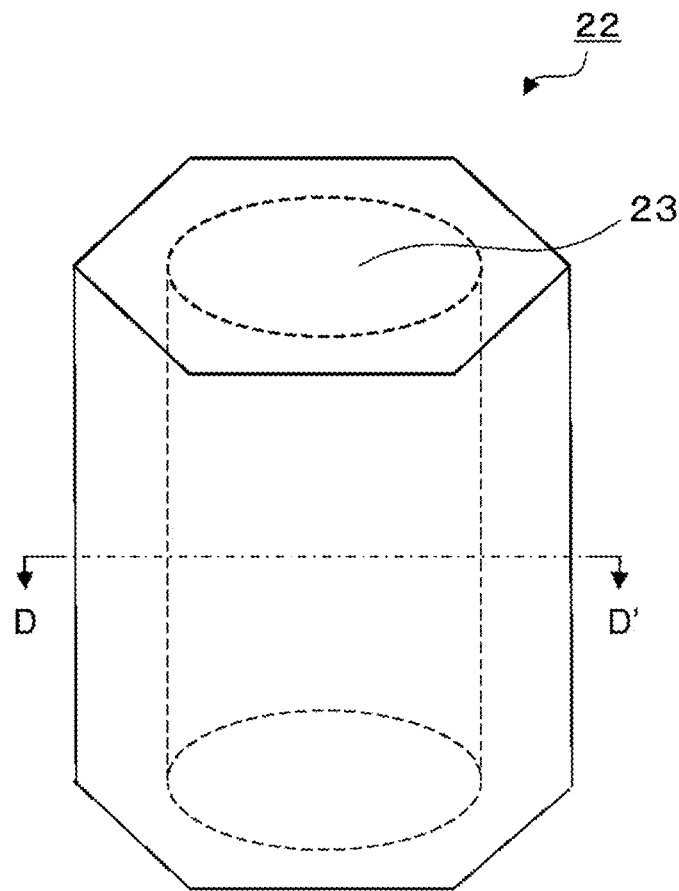
FIG. 3A is a view of a single-crystal silicon carbide ingot 22 according to the present embodiment.
Figure 3B:
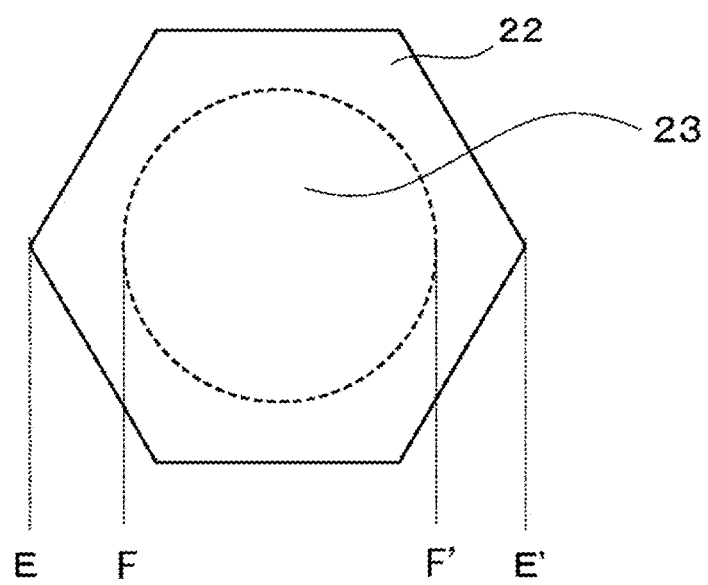
FIG. 3B is a D-D' sectional view.

FIG. 2 shows a substantially circular columnar single-crystal silicon carbide ingot 21. FIG. 2(a) is a perspective view and FIG. 2(b) is a cross-sectional view in the A-A' sectional view in FIG. 2(a). In addition, the length of the B-B' of FIG. 2(b) may be the diameter of the single-crystal silicon carbide ingot 21, and the region having C-C' in FIG. 2(b) as a diameter may be a central region 23 of the single-crystal silicon carbide ingot 21. FIG. 3 shows a substantially polygonal columnar single-crystal silicon carbide ingot 22. FIG. 3(a) is a perspective view, and FIG. 3(b) is a cross-sectional view in the D-D' sectional view in FIG. 3(a). In addition, FIG. 3 has the substantially polygonal columnar shape, but a maximum length passing through the center of the D-D' sectional view in FIG. 3(a) may be the diameter, and for example, the length of E-E' in FIG. 3(b) may be a diameter of the single-crystal silicon carbide ingot 22. Furthermore, the region having F-F in FIG. 3(b) as a diameter may be a central region 23 of the single-crystal silicon carbide ingot 22.

The length of the single-crystal silicon carbide ingot of the present embodiment in the crystal growth direction is preferably 10 mm or more, and more preferably 15 mm or more. In addition, a difference between the diameter of the upper surface and the diameter of the lower surface of the single-crystal silicon carbide ingot is preferably small, and the difference may be 0 mm or more and 0.5 mm or less.

A wafer cut perpendicular to the crystal growth direction (c-axis direction) from the single-crystal silicon carbide ingots 21 and 22 of the present embodiment can be the above-described single-crystal silicon carbide wafer 31. That is, the wafer cut from the single-crystal silicon carbide ingots 21 and 22 of the present embodiment has the above-described excellent features.

Moreover, the central region 23, which is a region in the single-crystal silicon carbide ingots 21 and 22, can be cut as a wafer, and thus, can serve as the central region 33 of the single-crystal silicon carbide wafer 31 described above. Furthermore, preferably, the single-crystal silicon carbide ingots 21 and 22 can have the above-described Features 1 and 2 and 3 and/or 4 on a surface cut perpendicular to the c-axis direction. Incidentally, since Features 1 to 4 are duplicated with the above-described description, the description thereof will not be repeated.

<Production Method>

Next, an example of a method for producing the single-crystal silicon carbide wafer 31 and the single-crystal silicon carbide ingots 21 and 22 described above (hereinafter sometimes referred to as a "production method of the present embodiment") will be described. Furthermore, the single-crystal silicon carbide wafer 31 and the single-crystal silicon carbide ingots 21 and 22 of the present embodiment are not limited to those produced by the production method shown herein.

Figure 4:
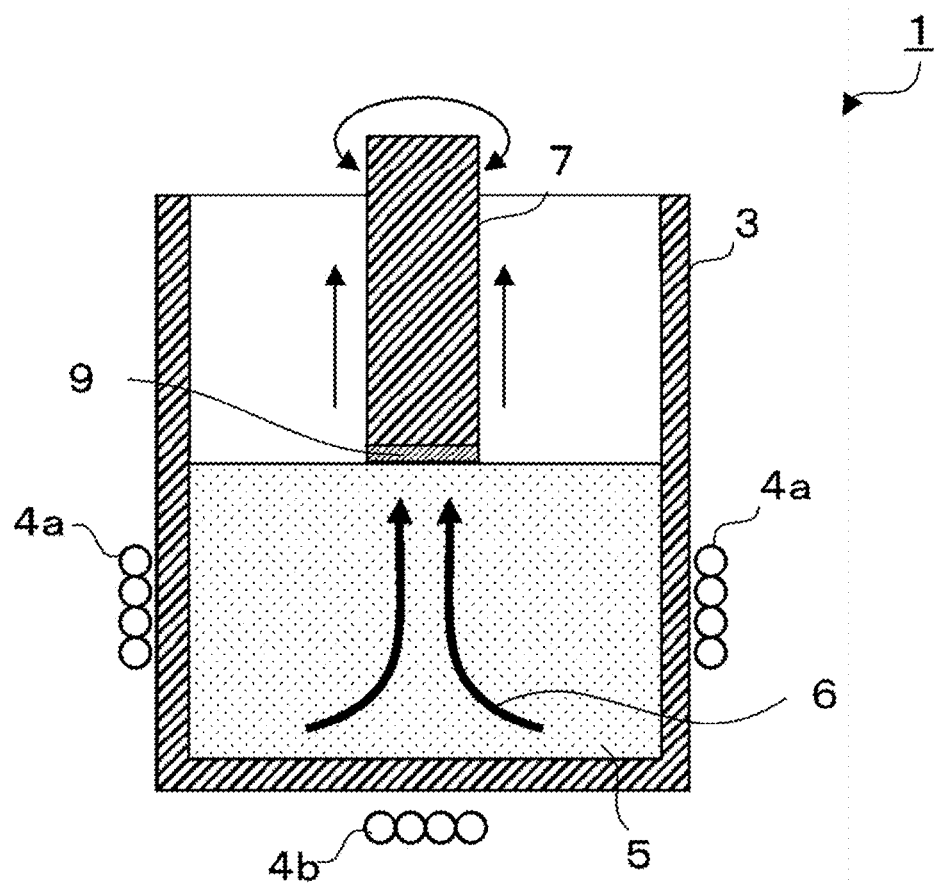
FIG. 4 is a view showing the outlines of a crystal growing device 1 according to the present embodiment.

FIG. 4 is a view showing the outlines of a crystal growing device 1 used in the production method of the present embodiment. The crystal growing device 1 includes a crucible 3, a pulling shaft 7, and heaters 4a and 4b (hereinafter sometimes collectively described as a heater 4). The crystal growing device 1 may have an internal space (hereinafter sometimes described as a "furnace") in which the crucible 3, the pulling shaft 7, and the like can be arranged, and the internal space may be capable of being kept in a sealed state. In addition, the heater 4 may be arranged in the internal space or may heat the internal space from the outside of it. Furthermore, the crystal growing device 1 may have a supply port (not shown in the Figure) capable of supplying various gases to the internal space, an exhaust port (not shown in the Figure) capable of discharging the gases from the internal space, a pressure gauge capable of measuring the pressure in the internal space, and the like.

In the production method of the present embodiment, a single-crystal silicon carbide is produced by growing a crystal while bringing a seed crystal 9 of silicon carbide into contact with a raw material solution 5 including silicon and carbon from above.

In the production method of the present embodiment, a heating step of heating a member to be used in a step of growing the crystal (hereinafter referred to as a "crystal growing step") is carried out before the crystal growing step. By this heating step, boron in the member can be reduced. As a result, an inconvenience that boron is unintentionally incorporated from the member can be reduced. In addition, the member may be heated in a halogen gas atmosphere. By doing so, the boron in the member can be volatilized as a boron halide. The member to be heated is a member including boron, and examples thereof include a crucible 3, a pulling shaft 7, and a jig for holding a seed crystal (not shown in the Figure), but in a case where there is another jig to be used, the jig may be also heated, to which the present invention is not limited. In the present specification, examples of the halogen gas include a gas formed of single halogen such as $Cl_2$ and $F_2$, an interhalogen gas such as $ClF_3$, $IF_5$, and $IF_3$, and a gas containing halogen, such as HCl.

In a case where the heating is performed in a halogen gas atmosphere, it is preferable that the heating conditions are 1,600° C. or higher and 2,000° C. or lower for 1 to 20 hours, and a pressure of the halogen gas is 5 to 100 kPa. The temperature may be more preferably 1,700° C. or higher and 2,000° C. or lower, and still more preferably 1,800° C. or higher and 2,000° C. or lower. In addition, in a case where the halogen gas is not present in the atmosphere, it is preferable that the heating conditions are 2,300° C. or higher and 2,350° C. or lower for 10 to 50 hours, and a pressure in the device is 1 to 100 kPa. Furthermore, the following temperature refers to the temperature of an object to be heated, and for example, in a case where the temperature is 1,600° C., it is heated so that the object to be heated becomes 1,600° C. In addition, the temperature of the object to be heated can be measured with a radiation thermometer.

The heating step may be performed before the crystal growing step, and a timing thereof is not particularly limited. For example, after obtaining a member to be subjected to a heating treatment, a heating step of heating the member may be performed at least once before carrying out the crystal growing step using the member for the first time. Alternatively, each time the crystal growing step is performed, the heating step may also be performed immediately before performing the crystal growing step. Alternatively, the heating step may also be performed at a predetermined timing such as the start of one day, the start of one week, or the start of one month.

The "pressure in the device" during the heating step described above can be adjusted by supplying or exhausting a gas so that the pressure in the furnace is within the above-described range. In addition, the "pressure of the halogen gas" refers to a pressure in the furnace in a case where only a halogen gas is supplied, and refers to a partial pressure of the halogen gas in the furnace in a case where the halogen gas and any dilution gas are supplied into the device. For the purpose of adjusting the above-described pressure, the furnace can be sealed after a gas is supplied, or a gas may be supplied and discharged at the same time to flow while maintaining a predetermined pressure. Examples of the gas to be supplied include an inert gas such as a He gas or an Ar gas, and a halogen gas. In addition, an $H_2$ gas may be used under low-reactivity conditions such as a low pressure. In a case where a halogen gas is used, it is preferable to use $Cl_2$ or HCl since it is easy to suppress a damage and a reactivity to the member in contact with the gas.

In a case where heating is performed in a halogen gas atmosphere, a separate operation may be performed to suppress an influence of the halogen gas on the seed crystal. For example, after the heating step is performed in a state where the seed crystal 9 is not installed, the temperature is once lowered to a workable temperature, and the seed crystal 9 is installed on the pulling shaft 7, then the next step may be performed. Alternatively, after an isolating member or a protective material capable of isolating the seed crystal 9 from the atmosphere in the furnace is installed, the heating step is performed, and the isolating member or the protective material is removed, then the next step may be performed. In the case of the latter operation, the temperature may not be intentionally lowered as long as the work is possible.

A degassing step of degassing an inside of the furnace may be included between the heating step and the crystal growing step. The degassing method may be a known method and is not particularly limited, but vacuum degassing is preferable since the atmosphere in the furnace is efficiently removed.

Next, the details of the crystal growing device 1 and an example of the crystal growing step will be described. The crystal growing device 1 shown in FIG. 4 has the raw material solution 5 including silicon and carbon inside the crucible 3, and the pulling shaft 7 has a long shaft as a rotation shaft and can rotate the seed crystal 9 attached to a tip of the long shaft. In addition, an upward flow 6 is formed so that the raw material solution 5 flows from the bottom to the top toward the seed crystal 9. The centers of the crucible 3 and the pulling shaft 7 do not necessarily have to coincide, but it is preferable that the centers coincide, and it is more preferable that the center of the crucible 3, the rotation shaft of the crucible 3, the center of the pulling shaft 7, and the rotation shaft of the pulling shaft 7 all coincide.

The crucible 3 is preferably a graphite crucible made of graphite, which can supply carbon to the raw material solution 5, but a crucible other than the graphite crucible can be used as long as a carbon source (for example, a powder or a liquid, which contains a hydrocarbon gas or carbon) can be added to the raw material solution 5 from other than the crucible. In order to make the composition of the raw material solution 5 uniform, it is preferable that the crucible 3 is rotated, and it is more preferable that the center of the crucible 3 is used as a rotation shaft. The rotation speed of the crucible 3 is preferably 5 to 30 rpm, and more preferably 5 to 20 rpm. By setting the ranges, the crystal growth can be efficiently performed without applying an excessive load to the device. In addition, the crucible 3 may be rotated reversing the rotation direction periodically in the positive direction and the opposite direction.

The raw material solution 5 is heated by the heaters 4a and 4b, and the like provided around the crucible 3, and is maintained in a molten state. The heaters 4a and 4b may be of an induction heating type or a resistance heating type. The temperature inside the crucible 3 is preferably 1,700° C. to 2,100° C. The temperature inside the crucible is obtained by measuring a surface of the raw material solution 5 or a vicinity thereof with a non-contact thermometer (IR-CZH7 Type manufactured by CHINO Corporation).

As the silicon source of the raw material solution 5, metallic silicon, a silicon alloy, a silicon compound, or the like can be used. In addition, as the carbon source of the raw material solution, a solid carbon source such as graphite, glassy carbon, and silicon carbide, a hydrocarbon gas such as methane, ethane, propane, and acetylene can be used.

The raw material solution 5 is not particularly limited as long as it is a solution including silicon and carbon, which is used for the crystal growth of silicon carbide, but a solution in which carbon is dissolved in a Si solvent to which additive elements have been added is preferably used. As the silicon alloy or the silicon compound used as the silicon source of the raw material solution include an alloy or compound of silicon with at least one additive element selected from Ti, Cr, Sc, Ni, Al, Co, Mn, Mg, Ge, As, P, N, O, Dy, Y, Nb, Nd, and Fe can be used. In particular, a Si—Cr alloy-based solvent including 20% to 60% by mole of Cr can be preferably used from the viewpoint that the solvent has a high carbon solubility, a low vapor pressure, and chemical stability. In addition, in a case where the above-described conductive impurity is added to the single-crystal silicon carbide, it is preferable to supply a material including a desired element to the raw material solution 5.

It is preferable that the inside of the crystal growing device 1 during the crystal growing step is set to be into an inert atmosphere by allowing an inert gas such as a noble gas to flow. The pressure is not particularly limited, but may be approximately atmospheric pressure (about 100 kPa). Moreover, in a case where a gas serving as a carbon source is supplied, a hydrocarbon-based gas such as $CH_4$ may be added to form a mixed gas atmosphere. In addition, in a case where the conductive impurity is supplied into the grown single-crystal silicon carbide, the gas which is a supply source of the conductive impurity may be added to provide a mixed gas atmosphere.

The raw material solution 5 in FIG. 4 forms the upward flow 6 from bottom to top inside the crucible 3 at the center of the crucible 3, and comes into contact with the center of the seed crystal 9. It is preferable to form the upward flow 6 since the concentration of the raw material solution 5 at the growth interface can be stabilized. In addition, the velocity of the upward flow at a position separated by 1 cm in a downward direction from the growth interface is preferably 0.5 cm/s or more and 5 cm/s or less. A method of forming the upward flow 6 is not particularly limited, and a method of adjusting an output of the side surface heater 4a and the bottom surface heater 4b, a method of providing a protrusion part or plate part capable of controlling the flow in the crucible 3, a method of forming an upward flow using a Lorentz force generated by an electromagnetic field from an external magnetic field coil can be considered. For example, in a case where the output of the heater 4b on the bottom surface is increased, a convection that goes upward from the heater 4b occurs to form the upward flow 6.

After the raw material solution 5 comes into contact with the seed crystal 9, the pulling shaft 7 relatively slowly pulls the seed crystal 9 upward with respect to the raw material solution 5 to grow the single-crystal silicon carbide 11. At this time, the pulling shaft 7 may be moved upward or the crucible 3 may be moved downward, but it is preferable to move the pulling shaft 7 upward in order to reduce the influence on the temperature distribution relatively small.

By relatively slowly pulling up the seed crystal 9 upward with respect to the liquid surface of the raw material solution 5, a convex meniscus may be formed between the seed crystal 9 and the liquid surface of the raw material solution 5 in the direction of the seed crystal 9 from the liquid surface of the raw material solution 5. It is presumed that the temperature of the raw material solution 5 around the seed crystal 9 decreases by forming the meniscus, resulting in an increased degree of carbon supersaturation and an improved growth rate. In addition, since the growth rate of the seed crystal 9 in the lateral direction can be increased by adjusting the shape of the meniscus, it is possible to make the diameter of the single-crystal silicon carbide 11, which is a grown crystal, larger than the diameter of the seed crystal 9.

Figure 5:
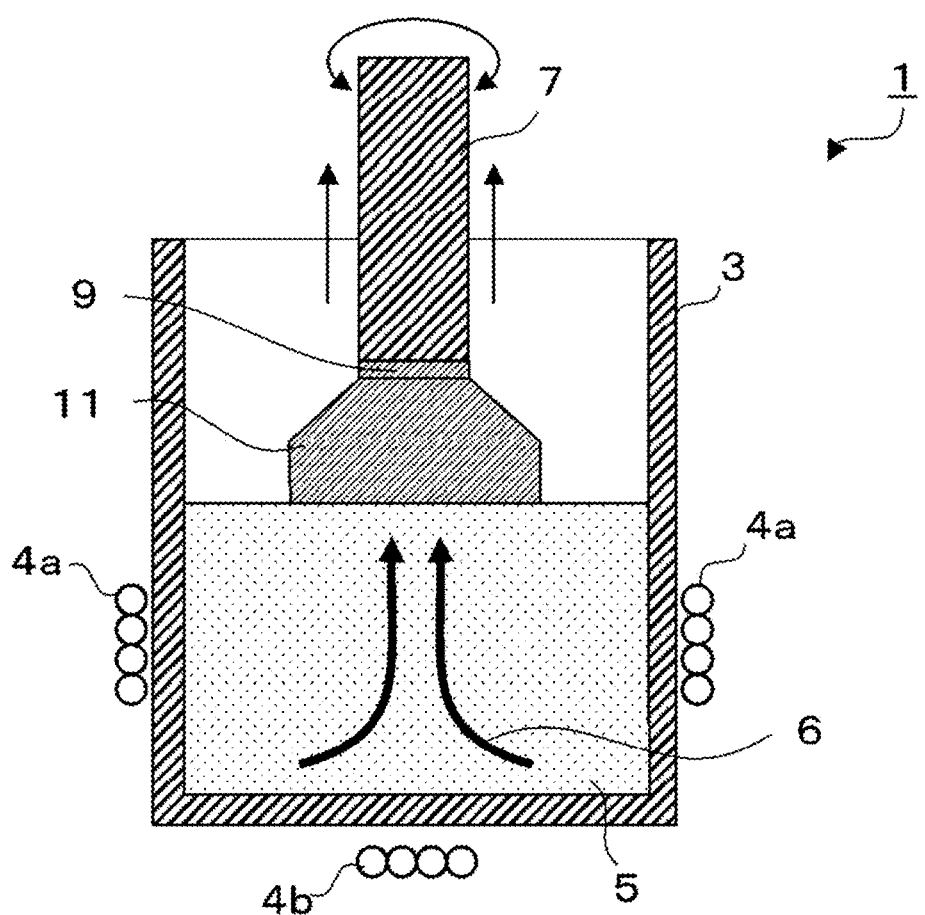
FIG. 5 is a view showing a state of the crystal growth using the crystal growing device 1.

The diameter of the single-crystal silicon carbide 11 may be the same as the diameter of the seed crystal 9, but as shown in FIG. 5, the single-crystal silicon carbide 11 may also be a grown crystal so that it has a diameter larger than that of the seed crystal 9. Examples of the method for making the diameter of the grown crystal larger than the diameter of the seed crystal 9 include the method of forming a meniscus as described above.

It is preferable that an angle θ of the meniscus to make the diameter of the grown crystal larger is 35 degrees or more. It may be more preferably 60 degrees or more, and still more preferably 65 degrees or more. In addition, since θ at a time of forming no meniscus is 90 degrees, an upper limit thereof is not particularly limited, but may be less than 90 degrees, and more preferably 85 degrees or less.

In addition, after the diameter is increased to a desired diameter, the crystal growth may be performed while maintaining a predetermined diameter. At this time, the meniscus may be formed or may not be formed, but in a case where the meniscus is formed, the above-described angle θ may be 10 degrees or more. In addition, an upper limit thereof may be set as long as the diameter of the grown crystal does not expand, but may be, for example, less than 35 degrees, and more preferably 30 degrees or less.

Figure 7A:
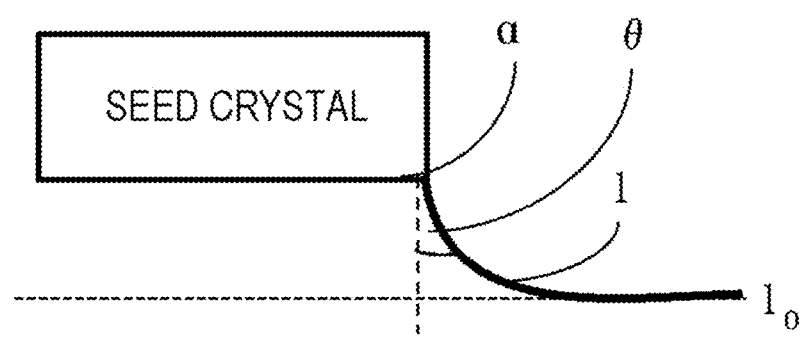
FIG. 7A and FIG. 7B are views showing an angle θ of a meniscus.
Figure 7B:
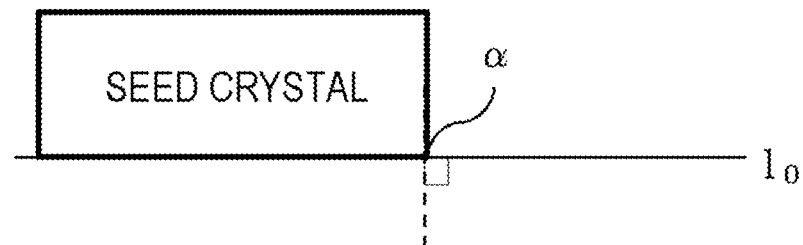

In the present specification, as shown in FIG. 7(A), the angle θ of the meniscus described above is defined as an angle formed between a perpendicular line to a liquid surface $l_0$ passing through a point α and a liquid surface l on a condition where the seed crystal is viewed from a side surface.

α: Contact between end part of seed crystal and liquid surface of raw material solution (hereinafter may be referred to as a "liquid surface")
$l_0$: Liquid surface in a case where no meniscus is formed
l: Liquid surface in a case where meniscus is formed Furthermore, in a case where no meniscus is formed, an angle formed between the above-described perpendicular line and the liquid surface $l_0$ is set to θ (=90 degrees) as shown in FIG. 7(B). In addition, after the grown crystal is formed on the surface of the seed crystal, the point α is a contact between the end part of the grown crystal and the liquid surface.

Figure 6:
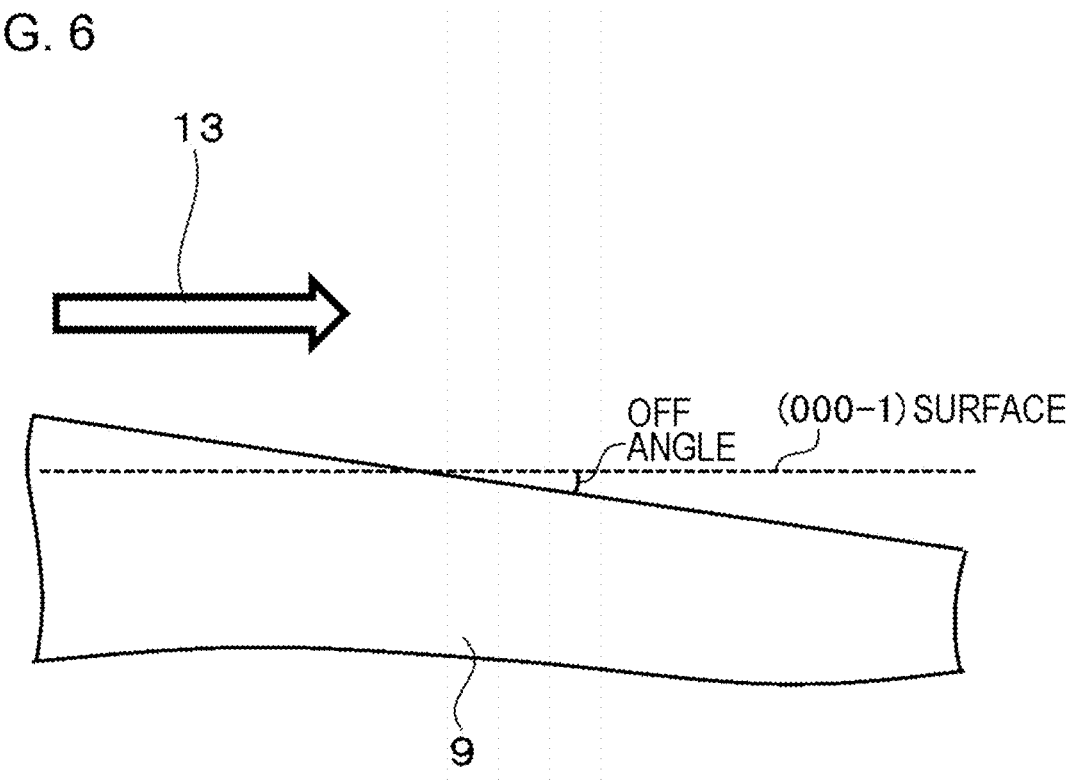
FIG. 6 is a schematic view of a cross-section of a seed crystal 9 having an off angle.

As the seed crystal 9, a crystal polymorph typified by 4H—SiC and 6H—SiC can be used. FIG. 6 is a schematic view of the surface of the seed crystal 9. The seed crystal 9 has a surface that is cut at an inclination of more than 0 degrees and 5 degrees or less with respect to the (000-1) surface, and an angle between the surface of the seed crystal 9 and the (000-1) surface is referred to as an off angle. The angle may be preferably 0.1 degrees or more and 5 degrees or less, and more preferably 0.5 degrees or more and 5 degrees or less. In addition, in order to obtain a desired single-crystal silicon carbide, the seed crystal 9 having a surface cut on the (000-1) surface without providing the off angle may be used. In addition, the step flow direction is a direction in which the step progresses. For example, in a case where the off angle is formed toward the [11-20] direction, the step flow direction is the [11-20] direction. With regard to the off angle, reference may be made to FIG. 20 of International Publication No. WO2014/034080, which is a patent document.

The thickness of the seed crystal 9 is not particularly limited, but may be usually 0.1 mm or more. In the present embodiment, the thickness of the seed crystal 9 is preferably 0.3 mm or more, more preferably 1 mm or more, and still more preferably 3 mm or more, because as the thickness of the seed crystal 9 becomes thicker, the defect density of the obtained single-crystal silicon carbide 11 tends to decrease. Furthermore, since in a case where the seed crystal 9 is excessively thick, the seed crystal 9 becomes excessively expensive, the thickness of the seed crystal 9 is usually preferably 10 mm or less.

At least, the raw material solution 5 that comes into contact with the crystal growth surface of the seed crystal 9 needs to be in a supersaturated state. As a method for obtaining a supersaturated state of carbon, which is a solute, a cooling method in which the seed crystal 9 is immersed in the raw material solution 5 having a saturated concentration of carbon, and then the carbon concentration is brought into a supersaturated state by overcooling, a temperature difference method in which the seed crystal 9 is immersed in the raw material solution 5 having a temperature gradient to grow the crystal at a low temperature part, or other methods can be used.

In a case of using the temperature difference method, it is possible to precipitate the crystal of silicon carbide on the crystal growth surface of the seed crystal 9 by bringing only the vicinity of the seed crystal 9 into a supersaturated state by, for example, controlling the heating of the heater 4 or cooling by the seed crystal 9, and pulling it up under rotation at a position at which the state where the seed crystal 9 and the liquid surface of the raw material solution 5 come into contact with each other can be maintained. In addition, as described above, the diameter of the grown crystal can be increased by forming the meniscus at this time.

In a case where the cooling method is used, the entire raw material solution 5 becomes supersaturated, and therefore, the crystal growth can also be caused by rotating the pulling shaft 7 in a state where the seed crystal 9 is immersed in the raw material solution 5.

The seed crystal 9 may be left fixed, but is preferably rotated in a plane parallel to the surface of the raw material solution 5. In a case where the seed crystal 9 is rotated, the rotation speed is preferably 20 to 300 rpm, and more preferably 20 to 150 rpm. By setting the rotation speed within the range, it is possible to efficiently perform the crystal growth without applying an excessive load to the device.

In addition, the rotation of the seed crystal 9 is preferably a rotation in which forward rotation and reverse rotation are repeated periodically, and the cycle thereof is about 30 seconds to 5 minutes. By changing the rotation direction periodically, the flow of the raw material solution 5 on the growth surface of the seed crystal during the crystal growth can be controlled.

The seed crystal 9 which is an off-substrate shown in FIG. 6 is cut out to have a predetermined off angle with respect to the (000-1) surface, as described above. The above-described seed crystal 9 is preferably attached to the pulling shaft 7 so that the surface having an off angle is brought into contact with the raw material solution 5 as the crystal growth surface.

In addition, in the crystal growing step, a temperature T1 of a crystal growth interface P1 and a temperature T2 of a solution at the point P2 having a distance of 5 mm from the crystal growth interface P1 satisfy T2>T1, and a temperature gradient between P1 and P2 is more than 0 K/cm and 40 K/cm or less. By slowly growing the crystal under such conditions, crystal distortion caused by heat can be reduced. Furthermore, the temperature gradient is a value calculated by thermal fluid simulation. The lower limit value of the temperature gradient may be preferably 2 K/cm or more, and more preferably 4 K/cm or more. In addition, the upper limit value of the temperature gradient may be preferably 30 K/cm or less, and more preferably 20 K/cm or less.

The single-crystal silicon carbide 11 is separated from the pulling shaft 7, and a periphery thereof is processed, as necessary, by polishing and the like, whereby a single-crystal silicon carbide ingot 21 or 22 as shown in FIG. 2(a) or FIG. 3(a) is provided. The crystal growth directions of the single-crystal silicon carbide ingots 21 and 22 coincide with the long shaft directions of the single-crystal silicon carbide ingots 21 and 22. In addition, the single-crystal silicon carbide ingots 21 and 22 may be separated from the seed crystal 9.

Furthermore, the single-crystal silicon carbide wafer 31 is produced by cutting the single-crystal silicon carbide ingots 21 and 22 produced as described above. The single-crystal silicon carbide wafer 31 can be used as a bare wafer or provided as a seed crystal wafer for epitaxial growth.

EXAMPLES

<Method for Producing Sample>

Example 1

First, as the above-described heating step, the crucible 3 and the pulling shaft 7 of the crystal growing device 1 as shown in FIG. 4 were heated in a halogen gas atmosphere with a pressure of a halogen gas (HCl was used in this case) in a furnace of 10 kPa at 1,800° C. or higher and 2,000° C. or lower for 20 hours.

Thereafter, after the temperature was lowered to about room temperature, the halogen gas in the crystal growing device 1 was removed, and a disk-like 4H—SiC seed crystal having a diameter of 150 mm and a thickness of 500 μm was fixed to the lower end of a pulling shaft 7 made of carbon. The growth surface of the seed crystal 9 to be in contact with the solution was a C surface and offset by 1 degree from the direction to the [11-20] direction.

Next, the inside of the crystal growing device 1 was replaced with an atmosphere gas (He+0.1% by volume of $N_2$), and the pressure in the device was set to 100 kPa. Furthermore, the Si—CR powder (containing 0.4% by mole of an acceptor-type element) in the crucible 3 was changed to a silicon melt by heating the heater 4, and the silicon melt was held to prepare an Si—C solution in which carbon was dissolved.

Next, the seed crystal 9 was brought into contact with the Si—C solution surface to grow the silicon carbide crystal from the lower end of the seed crystal 9. At this time, the temperature of the solution surface was set to 1,950° C., and the conditions for forming an upward flow of the solution with respect to the growth interface during the growth were used. The solution flow was made into a desired upward flow by control of the conditions thereof by causing a Lorentz force to act on the solution side by an electromagnetic field formed by the energization of a magnetic field coil.

Thereafter, while rotating the pulling shaft 7 to rotate the seed crystal 9 at a maximum of 30 rpm, the pulling rate of the pulling shaft 7 was appropriately adjusted in accordance with the crystal growth rate, and the growing was continued until the crystal length exceeded 20 mm. During this crystal growth, the rotation speed of the pulling shaft 7 was controlled to a maximum of 100 rpm, and the temperature near the growth interface was controlled to 1,950° C.±20° C. In addition, the temperature T1 of the crystal growth interface P1 and the temperature T2 of the solution at the point P2 having a distance of 5 mm from the crystal growth interface P1 satisfy T2>T1, and the temperature gradient between P1 and P2 was controlled to 18 K/cm. The temperature and the temperature gradient at the growth interface were realized by controlling an output balance of the heater that heats the crucible. Next, the obtained single-crystal silicon carbide was separated from the pulling shaft.

A central part of the separated single-crystal silicon carbide was sliced to a thickness of 500 μm at an off angle of 4 degrees with respect to the (0001) surface using a wire saw, and then the Si surface side was mirror-polished to obtain a single-crystal silicon carbide wafer.

Samples of Examples 2 to 4 and Comparative Examples 1 to 6 were created by partially changing the production method for the sample of Example 1. Hereinafter, only the points that were modified from Example 1 are shown.

Example 2

—Heating Step—
Time: 10 hours
—Step of Growing Crystal—
Temperature gradient: 12 K/cm
Acceptor element: 0.5% by mole, $N_2$: 0.1% by volume Example 3

—Heating Step—
Time: 3 hours
—Step of Growing Crystal—
Temperature gradient: 7 K/cm
Acceptor element: 0.5% by mole, $N_2$: 0.15% by volume Example 4

—Heating Step—
Temperature: 2,300° C. or higher and 2,350° C. or lower
Time: 10 hours
Pressure of halogen gas: 0 kPa (partial pressure of Ar gas: 10 kPa)
—Step of Growing Crystal—
Temperature gradient: 10 K/cm
Acceptor element: 0.4% by mole, $N_2$: 0.15% by volume Comparative Example 1

—Heating Step—
Not included
—Step of Growing Crystal—
Temperature gradient: 10 K/cm
Acceptor element: 0.5% by mole, $N_2$: 0.15% by volume Comparative Example 2

—Heating Step—
Not included
—Step of Growing Crystal—
Temperature gradient: 15 K/cm
Acceptor element: 0.8% by mole, $N_2$: 0.15% by volume Comparative Example 3

—Heating Step—
Not included
—Step of Growing Crystal—
Temperature gradient: 13 K/cm
Acceptor element: 0.7% by mole, $N_2$: 0.15% by volume Comparative Example 4

—Heating Step—
Not included
—Step of Growing Crystal—
Temperature gradient: 7 K/cm
Acceptor element: 0.7% by mole, $N_2$: 0.15% by volume Comparative Example 5

—Heating Step—
Time: 10 hours
—Step of Growing Crystal—
Temperature gradient: 50 K/cm
Acceptor element: 0.7% by mole, $N_2$: 0.15% by volume Comparative Example 6

—Heating Step—
Temperature: 1,900° C. or higher and 2,100° C. or lower
Time: 10 hours
—Step of Growing Crystal—
Temperature gradient: 70 K/cm
Acceptor element: 0.7% by mole, $N_2$: 0.15% by volume Evaluation of Samples Various characteristics of the obtained samples were evaluated.

[Boron Concentration and Conductive Impurity Concentration]

One point at the center of the single-crystal silicon carbide wafer was measured by secondary ion mass spectrometry (SIMS). In addition, the n-type carrier concentration was calculated, based on a difference between the concentration of the obtained donor-type conductive impurities (hereinafter also referred to as the "donor concentration") and the concentration of the acceptor-type conductive impurities (hereinafter the "acceptor concentration").

Moreover, with regard to Examples 1 to 4, the boron concentrations at one point at the center (central point) of the single-crystal silicon carbide wafer 31 and four points in the periphery around the center 50 mm apart from the center (peripheral point) were measured by the same method as that at the one point at the center. As a result, all of the obtained boron concentrations at the five points were $1.0 \times 10^{16}$ atoms/cm$^3$ or less. In addition, for the four pairs of the central point and each of the four peripheral points, the evaluation value was calculated by an expression of "(Boron concentration at peripheral point-Boron concentration at central point)/Boron concentration at central point". As a result, all of the evaluation values of the four pairs were in the range of −0.3 or more and 3.0 or less.

[Basal Plane Dislocation Density]

A basal plane dislocation density was measured by the etch pit method using KOH described above. Specifically, the single-crystal silicon carbide wafer CMP-polished on an Si surface side was immersed in a KOH melt which had been heated to 520° C. for 30 minutes in an air atmosphere. After being taken out, the single-crystal silicon carbide wafer was washed with ultrapure water and used for measurement. A region within 10 cm from the center of the single-crystal silicon carbide wafer was observed. An optical microscope (BX53 manufactured by Olympus Corporation) was used for the observation, the field of view at the time of observation was set to a region of 1 cm on each four side, and the entire observation region was evaluated by scanning with a camera.

[Misorientation in Crystal Plane]

A misorientation was measured by the above-described method at each of a total of five points of one point at the center of the single-crystal silicon carbide wafer and four points in the outer peripheral part of the wafer (0 degrees, 90 degrees, 180 degrees, and 270 degrees, each of which is a point 80% of the wafer radius apart from the center). Then, an average value of the misorientations at the five points was calculated.

[Electrical Resistivity]

By the above-described method, an electrical resistivity was measured at each of a total of five points of one point at the center of the single-crystal silicon carbide wafer and four points in the outer peripheral part of the wafer (0 degrees, 90 degrees, 180 degrees, and 270 degrees, each of which is a point 80% of the wafer radius apart from the center). Then, an average value of the electrical resistivities at the five points was calculated.

The evaluation results are shown in Table 1. In addition to the characteristics, the off angle from the (0001) surface, the donor concentration, the acceptor concentration, the n-type carrier concentration, and the temperature gradient are shown in the table.

TABLE 1

| | Boron concentration $\times 10^{16}$ atoms/cm$^3$ | Basal plane dislocation density counts/cm$^{-2}$ | Misorientation in crystal plane arcsec | Electrical resistivity mΩcm | n-Type carrier concentration $\times 10^{19}$ atoms/cm$^3$ | Donor concentration $\times 10^{19}$ atoms/cm$^3$ | Acceptor concentration $\times 10^{19}$ atoms/cm$^3$ | Temperature gradient [K/cm] |
|---|---|---|---|---|---|---|---|---|
| Example 1 | 0.03 | 16 | 28 | 19 | 4.8 | 5.8 | 1 | 18 |
| Example 2 | 0.1 | 15 | 25 | 21 | 5 | 6.2 | 1.2 | 12 |
| Example 3 | 0.3 | 19 | 20 | 20 | 6.2 | 7.5 | 1.3 | 7 |
| Example 4 | 0.9 | 25 | 23 | 24 | 6.2 | 7.3 | 1.1 | 10 |
| Comparative Example 1 | 2 | 110 | 69 | 75 | 4.8 | 7.7 | 2.9 | 10 |
| Comparative Example 2 | 5 | 350 | 75 | 150 | 2.9 | 7.9 | 5 | 15 |
| Comparative Example 3 | 20 | 780 | 108 | 750 | 3.7 | 7.7 | 4 | 13 |
| Comparative Example 4 | 50 | 1,500 | 120 | 1,500 | 4.1 | 7.6 | 3.5 | 7 |
| Comparative Example 5 | 0.1 | 2,500 | 135 | 200 | 3.9 | 7.7 | 3.5 | 50 |
| Comparative Example 6 | 0.05 | 1,900 | 130 | 190 | 3.5 | 8.1 | 4.2 | 70 |

As described above, it can be seen that Examples 1 to 4 are the single-crystal silicon carbide wafers which have the above-described Features 1 to 4, and have a low concentration of boron which is an unavoidable impurity, excellent crystallinity due to a reduction in basal plane dislocation and a reduction in misorientation, and an excellent conductivity. On the other hand, Comparative Examples 1 to 6, produced by methods different from those of Examples 1 to 4, do not have at least one of the above-described Features 1 or 2, and do not have at least one of Features 1 to 4. Furthermore, as described above, in Examples shown here, HCl was used as the halogen gas in the furnace, but the present inventors have confirmed that the same results can be obtained in a case of using other halogen gas.

Although some or entirety of the embodiments are described as in the following supplementary notes, the present invention is not limited thereto.

1. A single-crystal silicon carbide wafer,
   in which boron is included at a concentration of $1.0 \times 10^{16}$ atoms/cm$^3$ or less in the single-crystal silicon carbide wafer, a region where a misorientation in a crystal plane of the single-crystal silicon carbide wafer is 50 arcsec or less is present on a surface of the single-crystal silicon carbide wafer, the region includes a center of the surface, and an area of the region is one fourth or more of an area of the surface.

2. The single-crystal silicon carbide wafer according to 1, in which the region has a basal plane dislocation density of 100 counts/cm² or less.

3. The single-crystal silicon carbide wafer according to 2, in which the region has a circular shape and a center of the region overlaps the center of the surface.

4. The single-crystal silicon carbide wafer according to any one of 1 to 3, in which an electrical resistivity of the single-crystal silicon carbide wafer is 60 mΩcm or less.

5. The single-crystal silicon carbide wafer according to any one of 1 to 4, in which a diameter of the single-crystal silicon carbide wafer is 100 mm or more.

6. A single-crystal silicon carbide ingot having a substantially circular columnar shape or a substantially polygonal columnar shape, in which boron is included at a concentration of $1.0 \times 10^{16}$ atoms/cm³ or less in a wafer cut perpendicular to a crystal growth direction, a region where a misorientation in a crystal plane of the single-crystal silicon carbide wafer is 50 arcsec or less is present on a surface of the wafer, the region includes a center of the surface, and an area of the region is one fourth or more of an area of the surface.

7. The single-crystal silicon carbide ingot according to 6, in which a length of the single-crystal silicon carbide ingot in the crystal growth direction is 10 mm or more.

This application claims priority based on Japanese Patent Application No. 2021-160608 filed on Sep. 30, 2021, the disclosures of which are incorporated herein by reference in their entireties.

REFERENCE SIGNS LIST 1 crystal growing device
3 crucible
4 heater
5 raw material solution
6 upward flow
7 pulling shaft
9 seed crystal
11 single-crystal silicon carbide
13 step flow direction
21 single-crystal silicon carbide ingot
22 single-crystal silicon carbide ingot
23 central region
31 single-crystal silicon carbide wafer
33 central region

The invention claimed is:

1. A single-crystal silicon carbide wafer, wherein boron is included at a concentration of $1.0 \times 10^{16}$ atoms/cm³ or less in the single-crystal silicon carbide wafer, a region where a misorientation in a crystal plane of the single-crystal silicon carbide wafer is 50 arcsec or less is present on a surface of the single-crystal silicon carbide wafer, the region includes a center of the surface, and an area of the region is one fourth or more of an area of the surface.

2. The single-crystal silicon carbide wafer according to claim 1, wherein the region has a basal plane dislocation density of 100 counts/cm² or less.

3. The single-crystal silicon carbide wafer according to claim 2, wherein the region has a circular shape and a center of the region overlaps the center of the surface.

4. The single-crystal silicon carbide wafer according to claim 1, wherein an electrical resistivity of the single-crystal silicon carbide wafer is 60 mΩcm or less.

5. The single-crystal silicon carbide wafer according to claim 1, wherein a diameter of the single-crystal silicon carbide wafer is 100 mm or more.

6. A single-crystal silicon carbide ingot having a substantially circular columnar shape or a substantially polygonal columnar shape, wherein boron is included at a concentration of $1.0 \times 10^{16}$ atoms/cm³ or less in a wafer cut perpendicular to a crystal growth direction, a region where a misorientation in a crystal plane of the single-crystal silicon carbide wafer is 50 arcsec or less is present on a surface of the wafer, the region includes a center of the surface, and an area of the region is one fourth or more of an area of the surface.

7. The single-crystal silicon carbide ingot according to claim 6, wherein a length of the single-crystal silicon carbide ingot in the crystal growth direction is 10 mm or more.

8. The single-crystal silicon carbide wafer according to claim 1, wherein a thickness of the single-crystal silicon carbide wafer is 50 μm or more and 500 μm or less.

9. The single-crystal silicon carbide wafer according to claim 1, wherein the surface of the single-crystal silicon carbide is ±5 degrees or less from the (0001) surface of 4H—SiC or 6H—SiC.

10. The single-crystal silicon carbide wafer according to claim 1, wherein the surface of the single-crystal silicon carbide has an off angle that is inclined by 0.5 degrees or more and 5 degrees or less from (0001) surface of the single-crystal silicon carbide.

11. The single-crystal silicon carbide wafer according to claim 1, wherein the single-crystal silicon carbide has an orientation flat.

12. The single-crystal silicon carbide wafer according to claim 1, wherein the single-crystal silicon carbide has a notch.

13. The single-crystal silicon carbide wafer according to claim 1, wherein boron is included at a concentration of more than 0 and $1.0 \times 10^{16}$ atoms/cm³ or less in the single-crystal silicon carbide wafer.

14. The single-crystal silicon carbide wafer according to claim 1, wherein boron is included at a concentration of more than 0 and $1.0 \times 10^{15}$ atoms/cm³ or less in the single-crystal silicon carbide wafer.

15. The single-crystal silicon carbide wafer according to claim 1,
   wherein the region has a basal plane dislocation density of 80 counts/cm² or less.

16. The single-crystal silicon carbide wafer according to claim 1,
   wherein the region has a basal plane dislocation density of 50 counts/cm² or less.

17. The single-crystal silicon carbide wafer according to claim 1,
   wherein an electrical resistivity of the single-crystal silicon carbide wafer is 50 mΩcm or less.

18. The single-crystal silicon carbide wafer according to claim 1,
   wherein an electrical resistivity of the single-crystal silicon carbide wafer is 30 mΩcm or less.

19. The single-crystal silicon carbide wafer according to claim 1,
   wherein the single-crystal silicon carbide wafer has a donor-type conductive impurity and an acceptor-type conductive impurity, in which the amount of the donor-type conductive impurity is more than the amount of the acceptor-type conductive impurity.

20. The single-crystal silicon carbide wafer according to claim 1,
   wherein n-type carrier concentration of the single-crystal silicon carbide wafer is $1 \times 10^{19}$ atoms/cm³ or more and $10 \times 10^{19}$ atoms/cm³ or less.

* * * * *